United States Patent [19]

Heckaman et al.

[11] Patent Number: 5,065,123

[45] Date of Patent: Nov. 12, 1991

[54] WAFFLE WALL-CONFIGURED CONDUCTING STRUCTURE FOR CHIP ISOLATION IN MILLIMETER WAVE MONOLITHIC SUBSYSTEM ASSEMBLIES

[75] Inventors: Douglas Heckaman, Indialantic; Ronald Vought, Melbourne; Edward Caraway, Indialantic, all of

[73] Assignee: Harris Corporation, Melbourne, Fla.

[21] Appl. No.: 591,034

[22] Filed: Oct. 1, 1990

[51] Int. Cl.$^5$ .......................... H01P 3/08; H01P 1/162
[52] U.S. Cl. .................................. 333/246; 333/251
[58] Field of Search ............... 333/12, 204, 205, 238, 333/246, 247, 251

[56] References Cited

U.S. PATENT DOCUMENTS

| | | | |
|---|---|---|---|
| 3,768,048 | 10/1973 | Jones, Jr. et al. | 333/238 |
| 3,936,778 | 2/1976 | De Ronde | 333/246 |
| 4,268,803 | 5/1981 | Childs et al. | 333/251 X |
| 4,270,106 | 5/1981 | Woermbke | 333/246 |
| 4,480,240 | 10/1984 | Gould | 333/246 |
| 4,513,266 | 4/1985 | Ishihara | 333/238 |
| 4,547,755 | 10/1985 | Roberts | 333/246 |
| 4,605,915 | 8/1986 | Marshall et al. | 333/238 |

Primary Examiner—Paul Gensler
Attorney, Agent, or Firm—Evenson, Wands, Edwards, Lenahan & McKeown

[57] ABSTRACT

A two-dimensional periodic conductive post array structure is used to suppress higher order wave propagation within a large microstrip housing assembly without attenuating the desired TEM mode of propagation. Substantially vertical conductive posts are spaced at appropriate wavelength periods in the X and Y directions on top of and through a microstrip substrate in a so called "waffle-wall" type configuration. The periodic post structure provides high microwave signal isolation by functioning as a band rejection filter both above the microstrip substrate and within the substrate to isolate between nearby active and passive circuit functions located on the microstrip substrate. The desired TEM mode microstrip transmission line is routed through the conductive post matrix to provide the signal, control and DC paths between circuit chips and other active and passive circuit functions.

27 Claims, 8 Drawing Sheets

WAFFLE WALL-CONFIGURED CONDUCTING STRUCTURE FOR CHIP ISOLATION IN MILLIMETER WAVE MONOLITHIC SUBSYSTEM ASSEMBLIES

BACKGROUND AND SUMMARY OF THE INVENTION

The present invention relates generally to microwave transmission circuits and, more particularly, to a conductive post structure for providing isolation between microwave circuit components and transmission media.

The use of conductive posts extending from a top conductive plane to a bottom conductive plane, forming a parallel plate type of structure, provides attenuation for waveguide modes of propagation within the parallel plate structure. For example, multi-layered printed wiring boards and multi-layered Teflon stripline assemblies make use of through-holes, which are metallic plated, to attenuate waveguide modes of propagation within the board or stripline assembly. The plated through-holes or so called "plated vias" are, however, randomly arranged on the wiring board and are spaced a sufficient distance away from the desired transverse electromagnetic (TEM) mode transmission lines to prevent distortion of the transmission line characteristic impedance, $Z_0$.

It is known that the top plane-to-bottom plane and/or a single-end grounded conductive post can be used in waveguide transmission lines to form bandpass and band rejection filters. The conductive posts are arranged periodically along an axis of wave propagation i.e., the Z axis. In these waveguide structures, the desired signal is customarily passed through the periodic post structure in a low order waveguide mode.

Microstrip is a type of TEM transmission line useful from DC to millimeter wave frequencies for implementing passive circuit functions and to serve as a signal interconnection medium for combining passive and active circuit functions into complex functional assemblies e.g. monolithic microwave integrated circuits (MMIC) subsystem assemblies. The microstrip geometry includes a thin ribbon "center" conductor located over and parallel to a single conducting ground plane. Generally, the thin ribbon conductor is attached to and supported above the conducting ground plane by a dielectric or microstrip substrate having a uniform thickness. The microstrip substrate lies atop or is formed integrally with the conducting ground plane. Because of the open nature of the microstrip center conductor, i.e. it is located atop the microstrip substrate and in contact with the surrounding air, a top conducting or ground plane forming shield, such as a metal housing cover, is typically provided to shield the microstrip from the outside world. Generally, the housing cover is spaced a sufficient distance away from the transmission lines so as not to require the entire assembly, i.e., the microstrip transmission medium and cover, to be electrically considered as having a complex unsymmetrical double dielectric stripline geometry.

An air cavity is formed between the microstrip center conductor and the top conducting plane of the housing cover. The air cavity allows the attachment of surface mount technology (SMT) components, for example, beam-leaded diodes, standard solder-on SMT parts, etc. to the top surface of the microstrip substrate. Further, to maximize microwave transmission circuit performance, holes are machined into the microstrip substrate which extend downward toward the bottom conducting ground plane for holding drop-in circuit components such as a MMIC chip carriers, flange and stud mounted transistors, switches, etc.

While microstrip is useful as a component mounting and interconnecting medium, it exhibits poor electrical isolation between components and/or the transmission medium due to the open nature of its top surface. Signal leakage or radiation occurs between adjacent transmission lines and components due to the inductive and capacitive coupling of the lines and components. At frequencies wherein the circuit cavity has natural resonances, strong waveguide mode-type coupling occurs across large distances within the cavity. These waveguide modes propagate between the microstrip ground plane and the top conducting plane or shield of the housing cover.

Prior attempts to solve this radiation problem have attempted to isolate the circuit components and transmission lines by milling narrow channels into the metal housings and placing the microstrip transmission lines and components therein. The channel dimensions are sized too narrowly to propagate the waveguide modes for the frequency bands desired so as to isolate the lines and components. However, this approach is very costly due to its time-consuming and labor-intensive nature of requiring precision custom-milled and fabricated housings and manual or die cut substrates for subsequent assembly. Alternately, where isolation and signal attenuation are not critical parameters, it is known to use a single microstrip substrate in a large cavity with waveguide mode absorbing material coated on the top ground plane and/or with properly located film or bulk absorbers arranged within the cavity. However, this creates a very large and bulky subsystem assembly.

There is therefore needed a structure which provides good isolation and signal attenuation within the air cavity formed between the microstrip substrate and housing cover as well as within the microwave substrate itself. The structure should be compact and be easy and inexpensive to fabricate and assemble.

The present invention meets these needs by providing a two-dimensional periodic conductive post array structure which can be used to suppress higher order wave propagation within a large microstrip housing assembly without attenuating the desired TEM mode of propagation. Substantially vertical conductive posts are spaced at appropriate wavelength periods in the X and Y directions on top of and through the microstrip substrate in a so called "waffle-wall" type configuration. The periodic post structure provides high microwave signal isolation between nearby active and passive circuit functions located on the microstrip substrate. The desired TEM mode microstrip transmission line is routed through the conductive post matrix to provide the signal, control and DC paths between circuit chips and other active and passive circuit functions.

It is an advantage of the present invention to arrange the conductive posts by pressing them into a periodic matrix of holes drilled through the microstrip substrate into the microcircuit housing base. A compression layer is inserted between the housing cover and a conductive foil layer lying atop the ends of the conductive posts to ground the posts. The housing cover, compression layer, and conductive foil assure that the conductive posts are properly grounded at each of their ends. This embodiment allows for full access to the microstrip line center conductor for placing parts, performing probe testing and tuning prior to hermetically sealing the housing cover to the housing base.

A further embodiment includes a housing cover having holes pre-drilled therein corresponding to the periodic matrix of holes formed through the microstrip substrate. The conductive posts are inserted into the holes of both the cover and substrate to form an interference fit. To aid the conductive post insertion, the posts can be, for example, formed of a metal sheet which is rolled into a cylindrical post configuration. This "roll post" can compress to form the interference fit. By inserting the roll posts into the holes of the housing cover and base, a grounding effect occurs on the circumference of the posts in contact with the hole side walls. This compensates for large tolerances which may occur when attempting to set the spacing of the cover from the substrate and the initial pin insertion length. Tapered drill holes can be provided in both the housing cover and microstrip substrate to allow easier post insertion.

Yet another embodiment reduces the impedance of the conductive posts by performing series resonance tuning of the assembly. A dielectric film is placed atop the ends of the conductive posts prior to the conductive foil, compression and housing cover layers. The dielectric film has a controlled thickness and dielectric constant which forms a capacitance in series with the inductance of the conductive posts. Proper selection of the dielectric thickness, dielectric constant, post diameter and post length, allows precise tuning of the structure to the desired resonant frequency.

A further embodiment includes the forming of a noncontact "air" coaxial capacitance gap between the circumference of the conductive posts at their upper ends and the sidewalls of the pre-drilled holes in the housing cover. The coaxial capacitance is used to series tune the post length remaining within the air cavity formed between the microstrip substrate and the housing cover. It is an advantage of this embodiment to provide a "clean" structure not requiring a dielectric film, conductive foil and associated compression layer. Further, it is also compatible with staggered or regional frequency tuning and direct DC grounding of selected posts.

Another embodiment forms a noncontact air coaxial capacitance gap between the circumference of the conductive posts at their lower ends and the sidewalls of the premachined holes in the microstrip substrate and housing base. This embodiment has the advantage of being able to form the housing cover with integrally coupled conductive posts. The posts can be formed as part of the housing cover using high-precision electron discharge milling (EDM) metal fabrication equipment. Further, the capacitive tuning holes in the microstrip substrate can be placed very accurately using standard computer-controlled machining equipment. The absence of the conductive posts extending upward from the microstrip substrate allows easier and simpler placement and tuning of the circuit components.

A still further embodiment forms the conductive posts integrally with the housing cover but only extending downward to near the surface of the substrate. Tuning is accomplished via the end dielectric gap capacitance which, for microstrip, is between the post end and the lower level metal microstrip ground plane. For co-planar waveguide (C.P.W.) and slot line, wherein the circuit ground plane is on the substrate's top side, then the end dielectric capacitance is formed in the air gap between the post end and the substrate's top metal surface ground plane. This embodiment has the advantage of providing a low-cost subsystem assembly.

In addition to rejecting propagation in the air cavity above the microstrip substrate, conductive posts formed of plated vias located throughout the substrate are arranged in a periodic matrix structure to prevent propagation within the substrate. The "in-substrate" array of posts can also be combined with the "above-substrate" matrix of conductive posts to fully isolate circuit functions. The in-substrate plated vias can also be tuned by etching an annular air gap between the top termination of the metal plated vias and the top surface metallization of the CPW, or slot line substrate to form a capacitance for providing series resonance. This has the advantage of providing increased high frequency isolation and/or to allow greater spacing between plated vias.

It should be noted that these substrates can be active semiconductor substrates as might be used for large "wafer scale" integrated microwave or micrometer-wave subsystem assemblies.

DETAILED DESCRIPTION OF THE DRAWINGS

Figure 1:
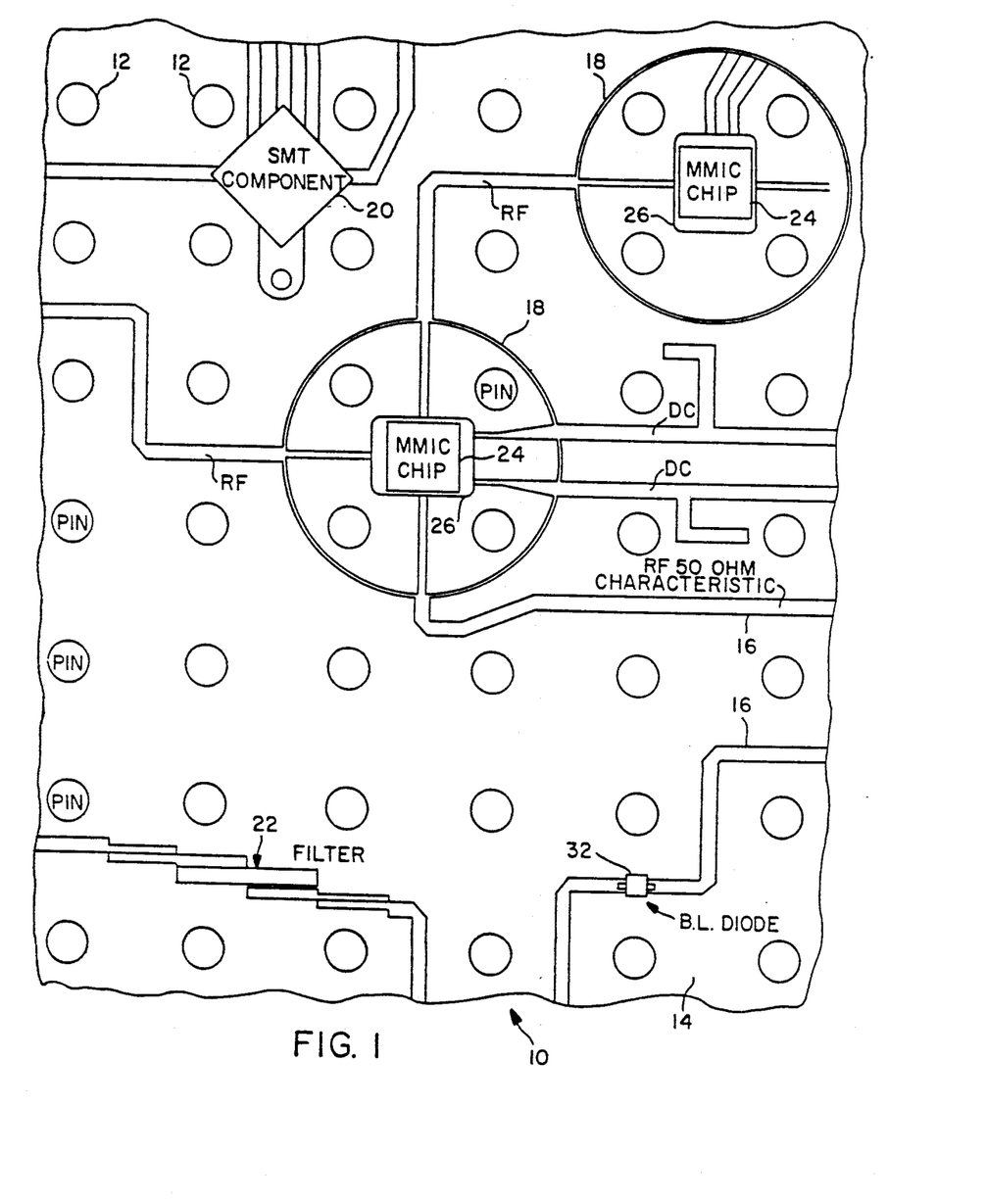
FIG. 1 is a partial top view of a microstrip substrate illustrating the periodic array of conductive posts of the present invention.

FIG. 1 is a partial top view of a microstrip substrate 10, forming part of an MMIC subsystem assembly, having indicated thereon the arrangement of a periodic array of conductive posts 12. The conductive posts form a so called "waffle-wall" type configuration between the microstrip substrate and housing cover (40, FIG. 2). The microstrip substrate 10, which may be of a ceramic or Teflon glass type of substrate, e.g. Duroid 5880 having a 0.005 inch thickness, has a top surface 14 on which is formed the interconnections between the active and passive circuit functions. The desired TEM mode microstrip transmission lines 16 are routed through the two-dimensional array of conductive posts 12 to provide RF signals ($Z_0 = 50$ ohms), control signals, and DC signal paths to the active and passive circuit functions. In FIG. 1, these microstrip transmission lines 16 couple various circuit functions such as MMIC chips 24, beam-leaded diodes 32, passive filters 22 and surface mount technology (SMT) components 20. The MMIC chips 24 are further shown arranged on a microwave IC substrate 26, typically formed of alumina with a 0.005 inch thickness. The MMIC chip 24 and its substrate 26 can be arranged on a chip carrier 18.

Figure 2:
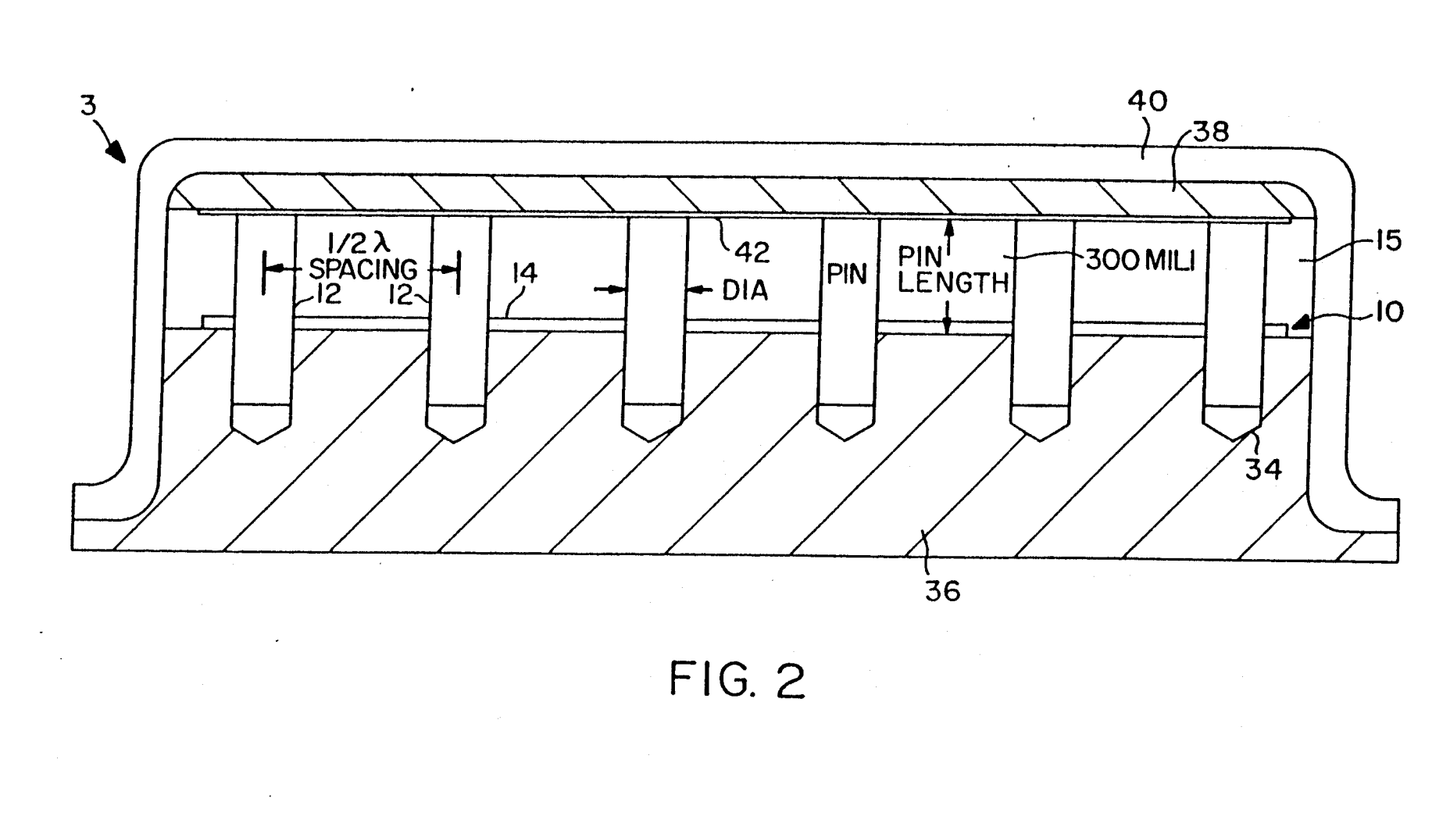
FIG. 2 is a cross-sectional side view of a microwave subsystem assembly according to the invention.

FIG. 2 is an embodiment showing the periodic array of conductive posts 12 which are used to suppress higher order wave propagation within the large microstrip housing subsystem assembly 3 without attenuating the desired TEM mode of propagation in the microstrip transmission lines.

The subsystem assembly 3, shown in the side view of FIG. 2, includes a metal housing base 36 such as an aluminum alloy type base e.g., Duroid 5880 having a pre-bonded soft microstrip substrate 10. Conductive posts 12 are pressed into holes 34 drilled through the microstrip substrate 10 and into the housing metal base 36. The microstrip transmission lines (not shown) formed on the top surface 14 of the microstrip substrate 10 are shielded from the outside world by the microcircuit housing cover 40 formed of a metal or dielectric material. Because of the poor electrical isolation which occurs due to the radiation into the air cavity 15, the conductive post matrix serves to provide high isolation over the large area covering the microstrip substrate 10 within the MMIC subsystem assembly 3. The conductive posts 12 are spaced at approximately half wavelength periods in an X-Y array as viewed in FIG. 1. The half wavelength spacing between the conductive post centers is known to give a maximum broad attenuation for periodic shunt low impedance posts in a microstrip transmission assembly.

Referring back to the top view of FIG. 1, the location of the conductive posts 12 does not significantly reduce the ability to use the microstrip transmission lines to interconnect the circuit components. Further, the conductive posts can be provided on the individual chip carriers 18 in keeping with the matrix structure to provide chip level isolation or shielding. The MMIC chips 24 can be, for example, up to approximately one-half wavelength in size without disturbing the periodic array of the conductive posts 12, e.g. at 60 GHz, the MMIC chips can be dimensioned on the order of 0.1 inches for a half wavelength size.

As shown in FIG. 2, a conductive foil layer 42 is placed atop the array of conductive posts 12. A resilient pliable pad, such as an elastomer pad 38, is placed atop the conductive foil layer 42, followed by the housing cover 40 to compress the conductive foil against the conductive posts 12 with the other end of the conductive posts 12 pressed into the microcircuit housing base 36. This coupling ensures that each end of the conductive posts 12 is completely grounded. As a typical example, the length of the conductive posts 12 between the microstrip substrate's top surface 14 and the conductive foil layer 42 is on the order of 0.2-0.4 inches. This length can be kept short and accurate, independent of the locational constraints and accuracies of the housing cover 40 through the use of the compression layer 38. Removal of the housing cover 40, compression and conductive foil layers 38 and 42 allows full access to the microstrip transmission line center conductor for performing parts placement, probe testing and tuning prior to finally sealing the housing cover 40.

Experimental results using a scale model brassboard with 0.24 inch long by 0.125 inch diameter conductive posts spaced 0.6 inches apart on center provided good isolation over the 0-7 GHz bandwidth. Scaling the experimental results to 70 GHz would require the use of 0.025 inch long by 0.013 inch diameter conductive posts spaced 0.06 inches apart on center. For large scale production, the conductive post insertion and the other parts assembly could be part of a fully automated process.

Figure 3:
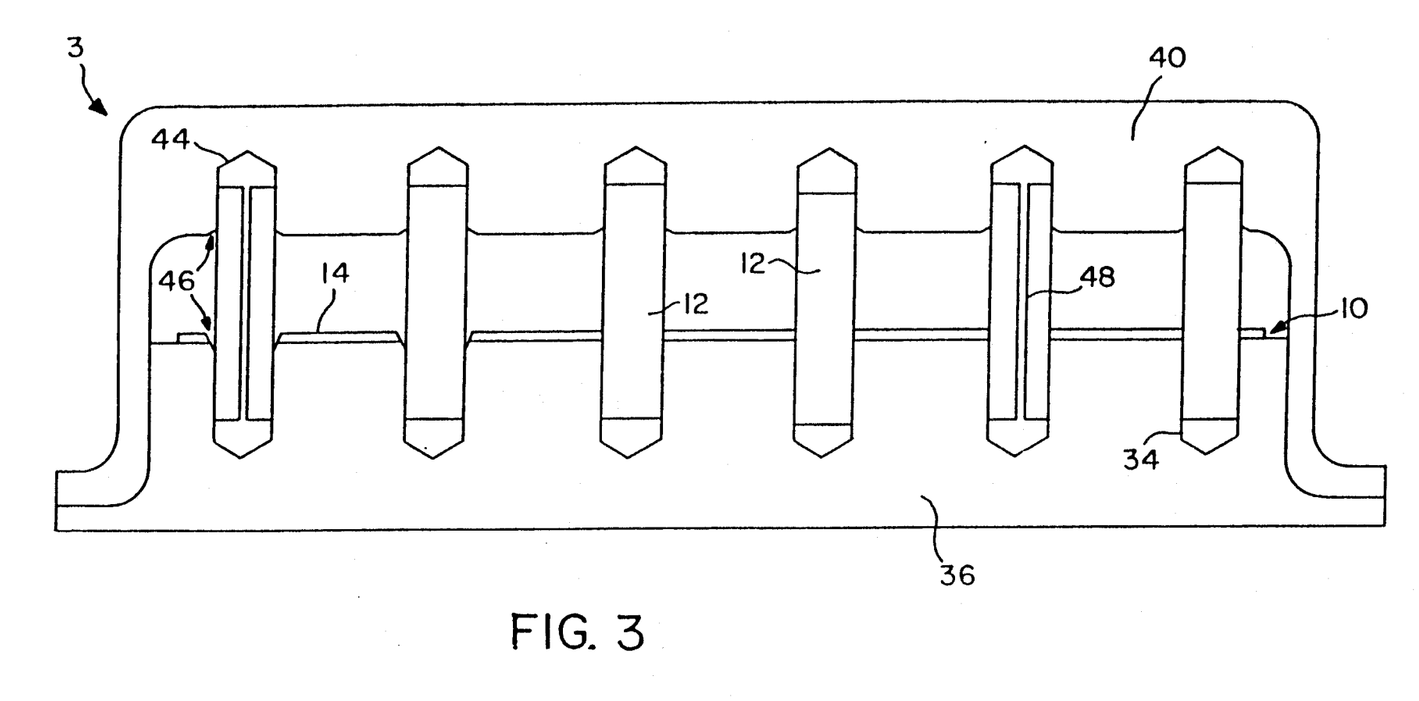
FIG. 3 is a cross-sectional side view of a second embodiment of the present invention.

FIG. 3 shows another embodiment of the present invention wherein the housing cover 40 includes a number of drill holes 44 corresponding to the drill holes 34 formed in the microstrip substrate 10 and housing base 36. The drill holes 34 may be precision drilled in accordance with an automated process. The conductive posts 12 are formed as tubular-shaped pins or roll posts having a tube wall thickness on the order of 2-3 mils. The roll posts 12 are provided with slots 48 which allows the roll posts to compress to form an interference fit when pressed into the drill holes 44 and 34. The drill holes in the housing cover 40 and the substrate 10 can also be tapered as shown at 46 to guide and simplify the conductive post alignment and insertion process.

In FIG. 3, the pliable tubular roll posts are grounded at their circumference to the side walls of the drill holes 44 and 34 formed in the thick metal housing cover 40 and the housing base 36, respectively. With this type of grounding, large tolerances in the distance between the housing cover 40, the microstrip substrate 10 as well as the initial pin insertion length can be accounted for. In the actual final assembly, a press can be used to achieve the required pressure to simultaneously begin inserting the entire array of conductive roll posts simultaneously. In this embodiment, the conductive posts 12 provide high thermal heat conductivity to the housing cover 40. The cover 40 could also be provided with an external heat sink such as heat removing fins (not shown).

Figure 4:
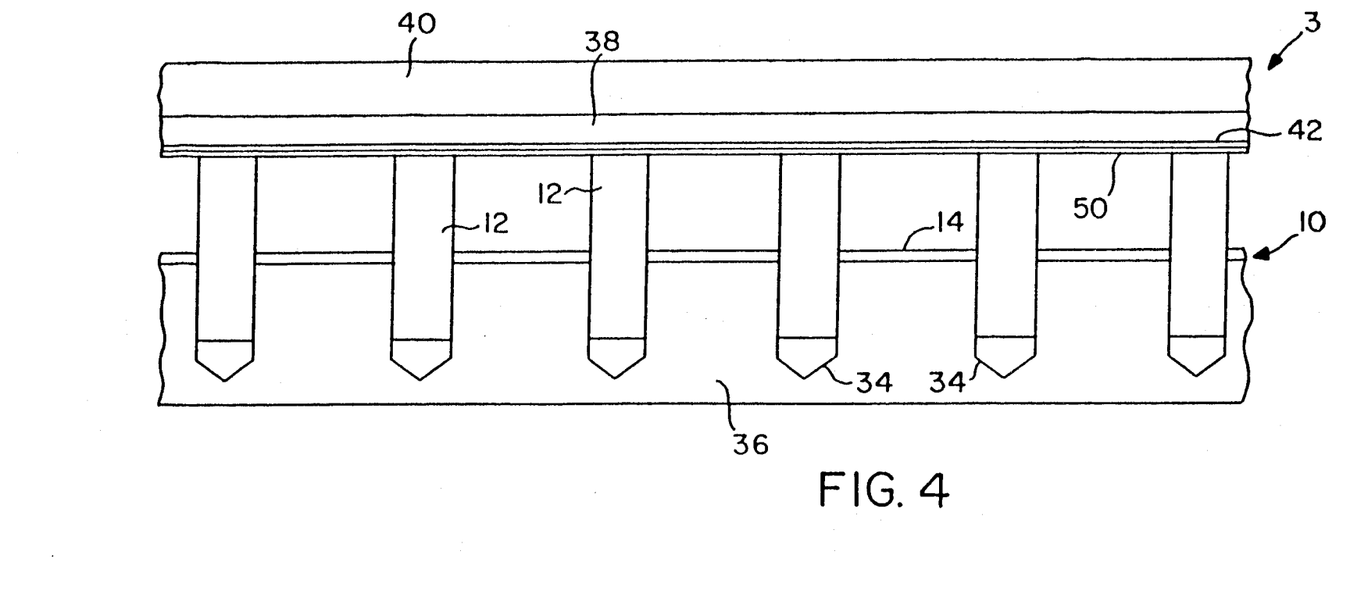
FIG. 4 is a partial cross-sectional side view of a third embodiment of the present invention.

Referring to the portion of the subsystem assembly 3 shown in FIG. 4, the impedance of the conducting posts 12 is reduced by performing series resonance tuning. A dielectric film 50 is placed between the top ends of the conductive posts 12 and the conductive foil layer 42. By controlling the thickness and dielectric constant of the dielectric film 50, accurate tuning of the conductive posts 12 is achieved. The dielectric film can, for example, be bonded to the top conductive foil layer 42, be deposited only on the ends of the conductive posts 12 or can be an entirely separate sheet which simply lies atop of the periodic array of posts 12.

The resonant frequency of the assembly 3 can be set by properly choosing the dielectric constant and the dielectric material thickness of the dielectric film 50 as well as by properly selecting the conductive post's diameter and length. In general, the conductive posts 12 should resonate in or near the frequency band of interest for the desired application of the assembly. The dielectric film 50 forms a capacitance between the ends of the conductive posts 12 and the conductive foil layer 42. This capacitance is in series with the inductance of each conductive post 12. The periodic array structure can therefore exhibit a bandwidth approximately one octave wide having very high rejection.

In application of the embodiment of FIG. 4, some of the conductive posts 12 can be DC coupled to the conductive foil layer 42 to provide good cavity rejection all the way down to zero frequency without a resulting loss in the localized high isolation for the top octave bandwidth. This type of full bandwidth isolation may be used, for example, for superheterodyne type receiver assemblies having several frequency down conversions which may yield an integrated assembly having maximum to minimum frequencies covering several decades, e.g., 60 GHz to 12 GHz to 600 MHz.

Figure 5:
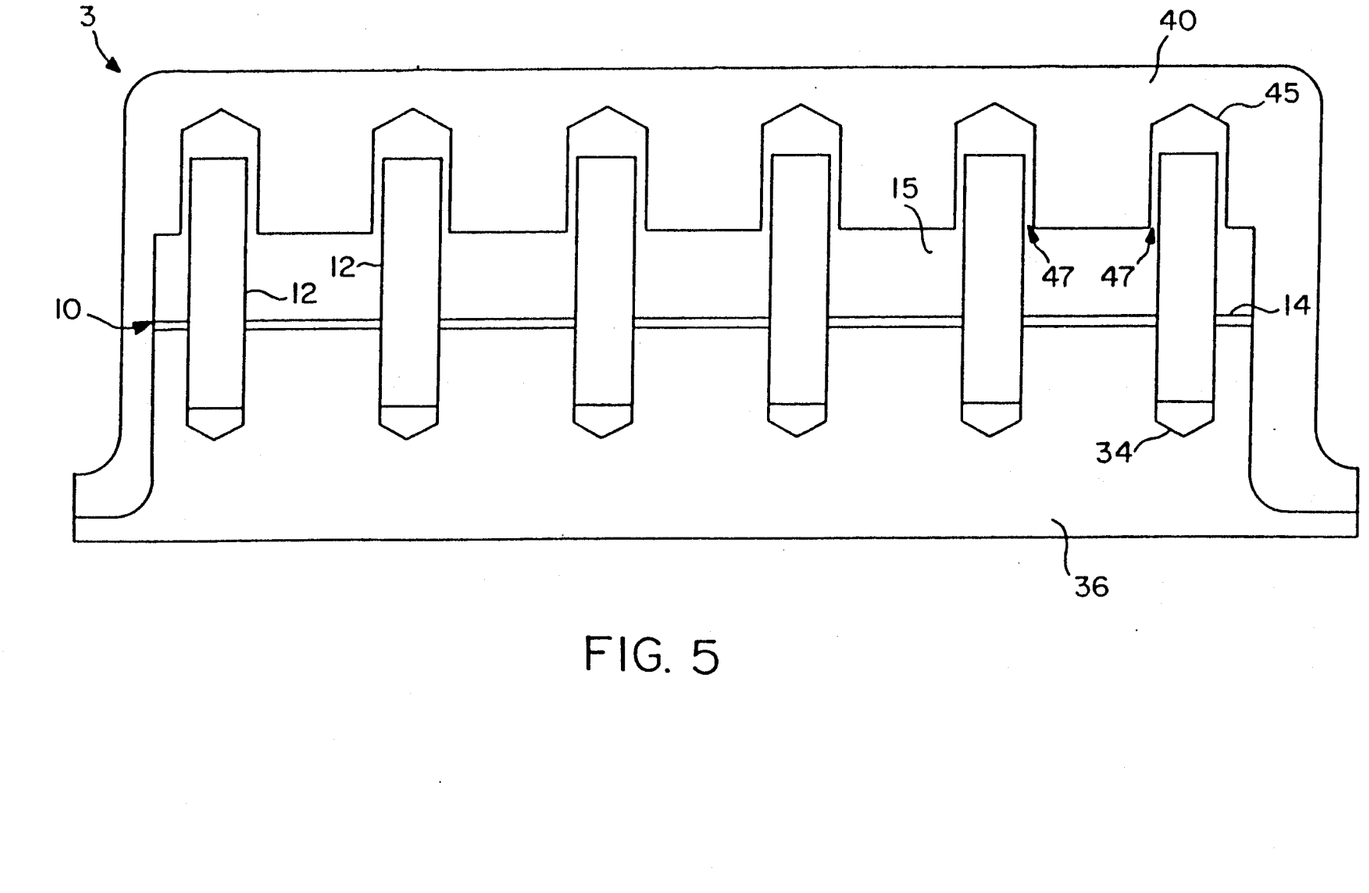
FIG. 5 is a cross-sectional side view of a fourth embodiment of the present invention.

Another embodiment shown in FIG. 5 makes use of a non-contacting "air" gap coaxial capacitor to tune the conductive posts 12. The housing cover 40, or a thick subcover (not shown) attached to the cover, is located close to the microstrip substrate top surface 14. Drill holes 45 are provided in the housing cover 40 and are dimensioned to have a diameter greater than that of the conductive posts 12. Upon hermetically sealing the housing cover 40 to the housing base 36, air gaps 47 are formed between the conductive posts 12 and the side walls of the drill holes 45 in the housing cover 40. This spacing creates a coaxial capacitive air gap which series tunes the conductive post length remaining within the air cavity 15. This capacitive coupling causes a low impedance connection from the housing cover 40 to the bottom ground plane for the microstrip transmission circuit and results in high isolation over the top frequency band.

The embodiment of FIG. 5 eliminates the need for the dielectric film, conductive foil layer and the compression layer required in the embodiment of FIG. 4. This provides a cleaner approach, from a microelectronic viewpoint, to isolate among and between circuit functions on the microstrip substrate. The use of the coaxial capacitive air gaps with the periodic arrayed conductive post structure provides better staggered or regional frequency tuning and direct DC grounding of selected conductive posts 12. The posts 12 can be custom tuned to a degree by adjusting the post lengths and the drill hole's diameter. By staggering the tuning, a wider band of rejection can be obtained although some degradation of isolation will occur. By regional frequency tuning, maximum isolation performance areas can be provided as required throughout a large integrated assembly 3. For example, a MMIC integrated subsystem assembly may have two receiver bands of operation, e.g., 44 GHz and 60 GHz, with a common local oscillator set at 52 GHz and yielding dual 8 GHz intermediate frequency outputs. This can be accomplished on a common microstrip substrate 10 using the continuous periodic X-Y conducting post grid structure with the posts 12 optimally tuned in certain regions for maximum isolation of nearby electrical functions.

Figure 6:
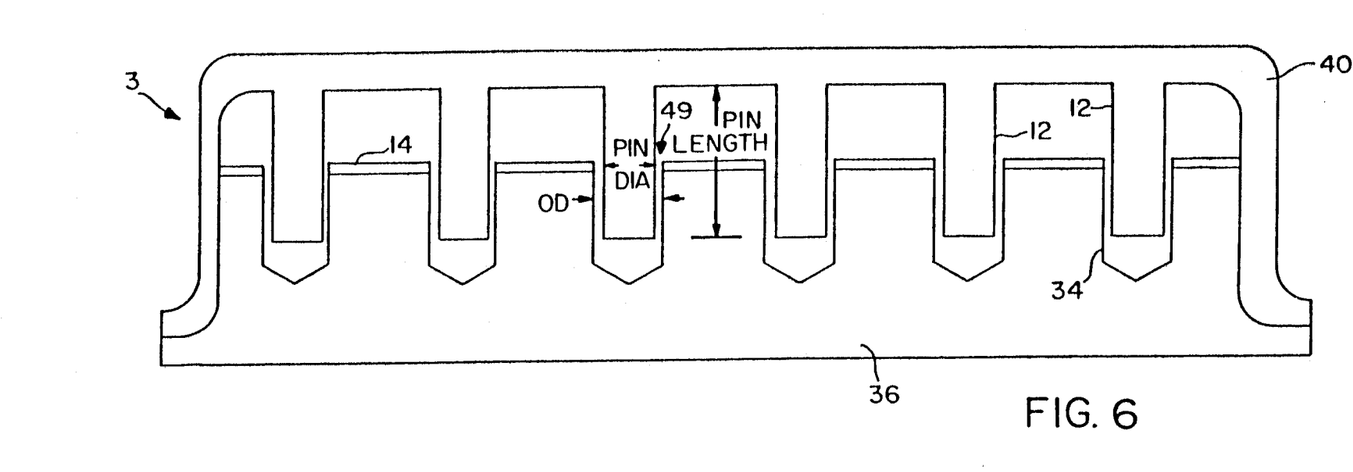
FIG. 6 is a cross-sectional side view of a fifth embodiment of the present invention.

The embodiment of FIG. 6, while electrically equivalent to the assembly shown in FIG. 5, forms the conductive posts 12 as part of the housing cover 40. The drill holes 34 formed in the microstrip substrate 10 and microstrip housing base 36 are dimensioned to have a diameter greater than that of the conductive posts 12. The coaxial capacitive air gaps 49 formed between the drill hole side walls and the outer circumference of the conductive posts allows series tuning of the conductive posts 12 as described above in FIG. 5. In this manner, individual posts 12 and interference fit drill holes in the microstrip substrate are not required. Further, the housing cover 40 and combined post structure 12 can be formed using high precision EDM metal fabrication equipment. The tuning capacitive holes 34, formed in the microstrip substrate 10 can be accurately placed at very low cost using standard computer controlled machining equipment. Without the conductive posts extending from the substrate's top surface 14, SMT part placement and the necessary tuning steps can be carried out easily without hindering obstructions.

Figure 7:
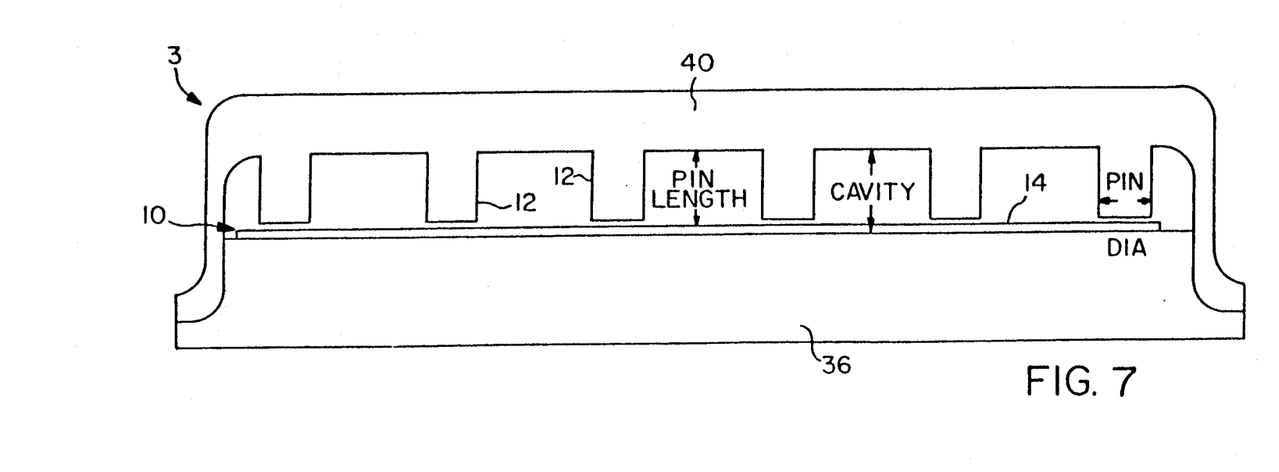
FIG. 7 is a cross-sectional side view of a sixth embodiment of the present invention.

Referring to FIG. 7, a further embodiment has the conductive posts 12 only extending to near the top surface of the microstrip substrate. The combined housing cover 40 and conductive post structure is therefore only tuned to a certain degree by the capacitance formed between the substrate 10 and the ends of the conductive posts 12. In this embodiment, the microstrip substrate 10 no longer requires the drilled holes. However, it is still necessary to keep the circuit components away from the conductive post area in order for the posts 12 to come near to the microstrip substrate's top surface 14 when assembled.

Figure 8:
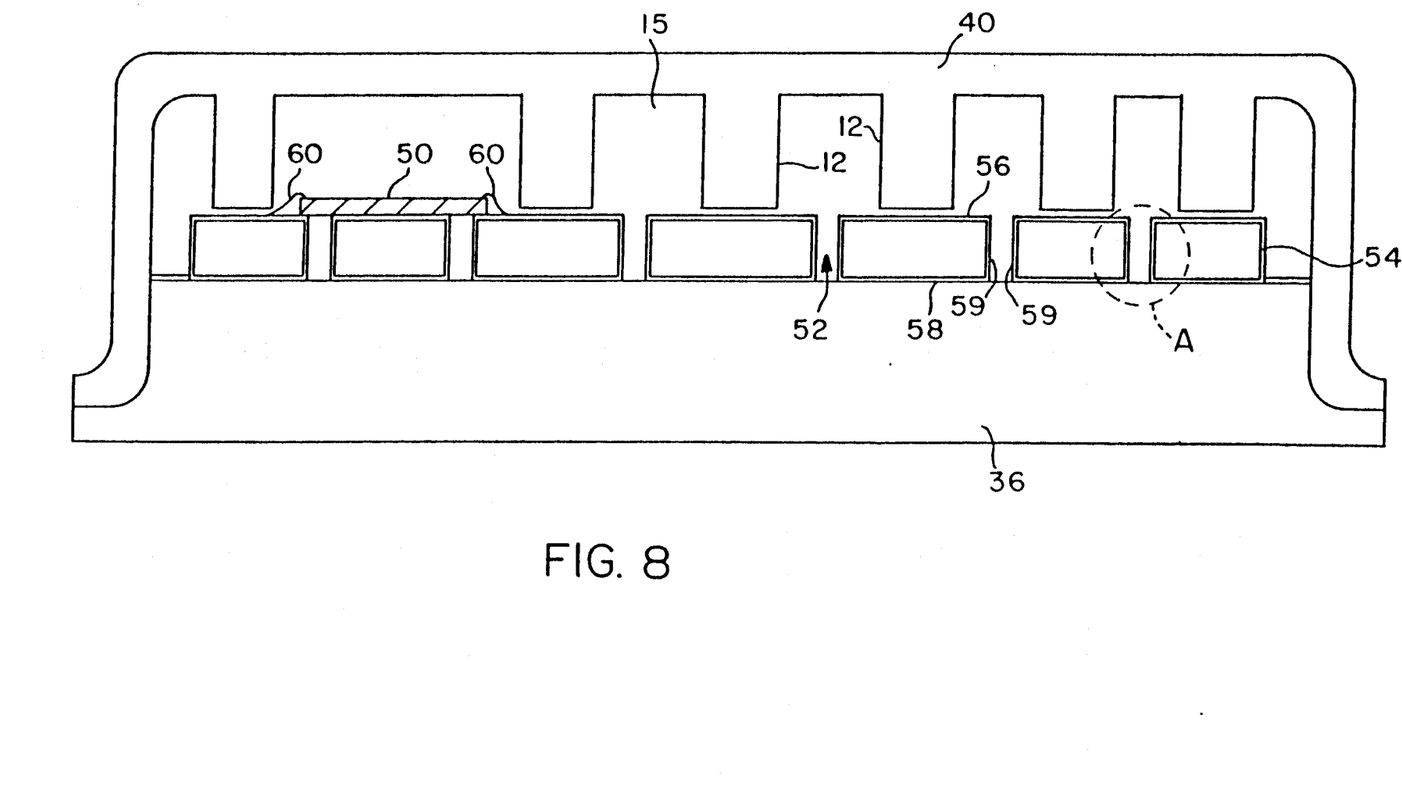
FIG. 8 is a cross-sectional side view of the in substrate conductive posts according to the present invention.

The conductive post matrix structure shown in the embodiments of FIGS. 2–7 is used to isolate circuit components formed on the microstrip substrate from the energy which radiates into the air cavity 15 formed between the substrate and the housing cover. For coplanar transmission lines formed on a thick dielectric substrate, the transmission energy can also radiate independently through the substrate itself as well as the air cavity. As shown in FIG. 8, a periodic array of plate-through 52 vias are formed in the thick dielectric substrate 54, such as an aluminum nitride AlN substrate, to perform isolation within the substrate itself. The single thick dielectric substrate 54 functions as a "carrier" to mount all of the required chip parts, such as SMT chip 50. The substrate 54 is thin film metalized on its top surface 56 and bottom surface 58 with a millimeter wave quality coating such as chromium/gold. These metal films 56 and 58 are electroplated up to a thickness sufficient for minimum RF attenuation and die bonding, such as 1.5 microns. The top surface metallization 56 is photofabricated to form coplanar transmission lines for signal runs between the circuit chips, the chip 50 being shown coupled to the top surface metallization 56 via leads 60.

The electroplated bottom surface 58 of the substrate 54 forms a good bond with the housing base 36. The periodic array of plated vias 52 are provided through the substrate 54 to perform isolation of the circuit components from energy propagating through the substrate 54. This prevents gain and phase ripples from occurring over the operating frequency band and will prevent performance degrading coupling from occurring between element channels within the circuit. The walls 59 of the via holes 52 are metal plated to provide top to bottom grounding vias.

FIG. 8 also shows the use of the combined housing cover 40 and conductive post structure 12, as described above, to perform mode suppression within the air cavity 15 above the substrate 54. The conductive posts 12 extend from the cover 40 down to near the top of the conducting ground plane surface 56 of the substrate 54 as described above with respect to FIG. 7. The conductive posts 12 and air gaps formed between thee post and the conducting ground plane 56 are designed to be series resonant near the frequency band of operation. As noted above, the conductive posts 12 function as waveguide mode band rejection filters and are used as low impedance cover to ground plane walls or "fences".

Figure 9A:
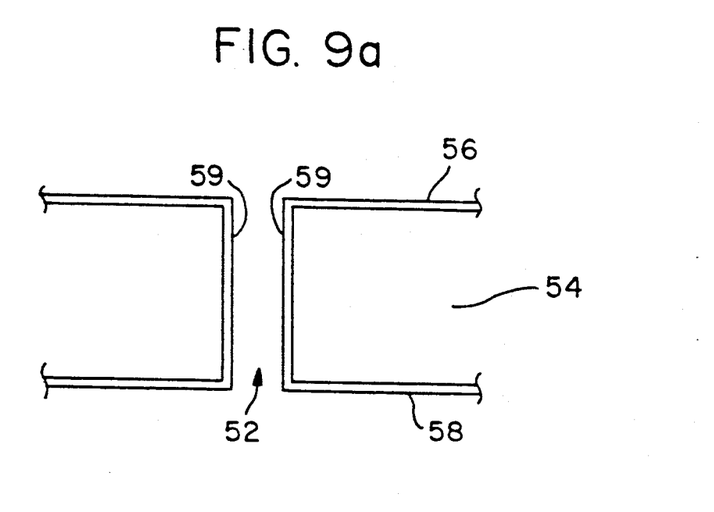
FIGS. 9a and 9b are enlarged views of area A shown in FIG. 8.

FIG. 9a is an enlarged view of the area A represented by the dashed circle in FIG. 8. This side view clearly shows the plated via hole 52 formed in the substrate 54.

Figure 9B:
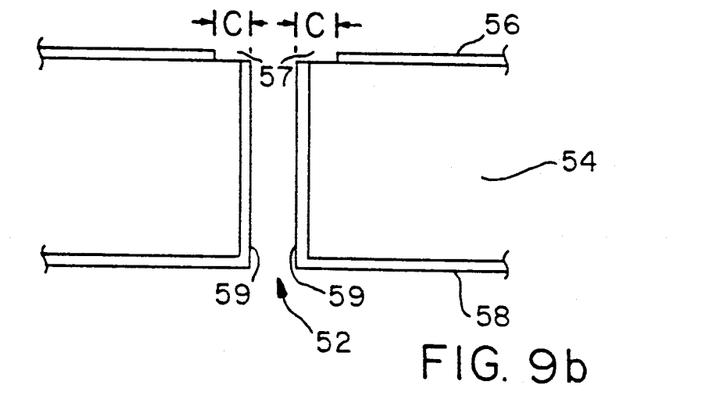

In an alternate embodiment shown in FIG. 9b, the conducting via holes 52 formed in the thick dielectric substrate 54 are provided as tuning posts in the substrate 54. The tuning is accomplished by etching the top surface metallization 56 in an annular fashion around the plated vias 52 between the top termination of the metalized via walls 59 and the continuation of the top surface metallization 56. The etched portion is shown in the side view of FIG. 9b and has an annular ring diameter of "C". This etching provides an air gap between the metal plated via walls 59 and the top surface metallization 56. This air gap forms a capacitance. By varying the dimensions of the etched annular ring, the matrix of the via holes can be series resonated to give increased high frequency isolation or to allow for wider spacing between the via holes 52. When used in conjunction with the above-substrate conductive posts 12 formed with the housing 40, maximum channel-to-channel isolation and the illumination of waveguide resonances, along with their associated destructive signal path coupling in the thick co-planar substrate 54 and air cavity 15 is obtained.

Figure 9C:
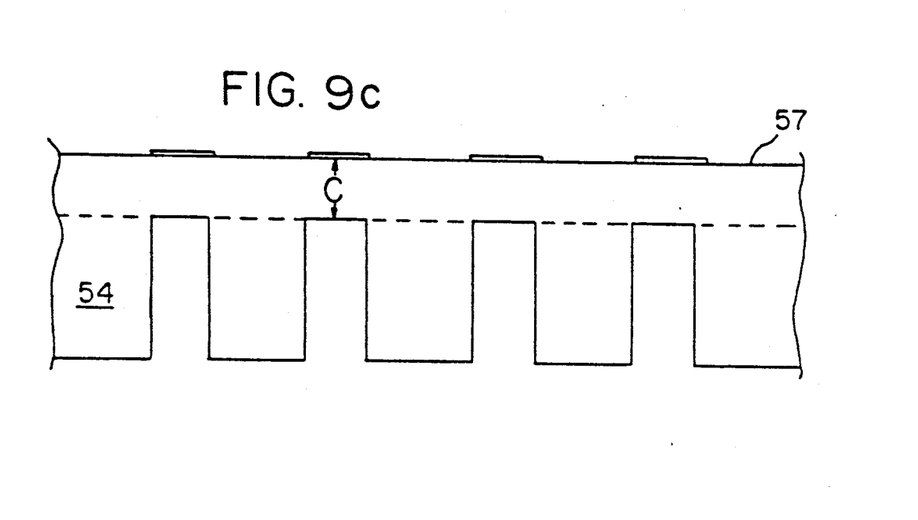
FIG. 9c is another embodiment of the present invention.

It should also be noted that the substrate 54 can be, for example, an active GaAs MMIC substrate. Typical three inch square or round GaAs substrates can have periodic arrays of conductive or resonant posts, connecting the top side C.P.W. ground plane to a wafer backside, plus an air gap tuned array of posts extending from a housing cover or subcover. Further, the resonant posts within the dielectric substrate can include, in addition to an etched slot on the top side 57 to form the capacitance as shown in FIG. 9b, a buried capacitor "C" formed by using a multilayer ceramic substrate 54 as shown in FIG. 9c.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A structure for isolating between spaced apart microwave circuit components and transmission media located on a top surface of a microstrip substrate, comprising:
    a bottom ground plane provided below said microwave substrate;
    a top ground plane located above said microwave substrate substantially parallel to said bottom ground plane; and
    a two-dimensional periodically arrayed matrix of conducting posts orthogonally arranged between said top and bottom ground planes for isolating microwave circuit components located between said posts on the microwave substrate, each end of the conducting posts forming said matrix being grounded to one of said top and bottom ground planes wherein each microwave circuit component to be isolated is spaced apart from and surrounded by a number of said conducting posts of said matrix of conducting posts to isolate the microwave circuit component.

2. A structure according to claim 1, further comprising:
    a housing metal base supporting the microstrip substrate; and
    a housing cover sealed to said housing metal base over the microstrip substrate and forming an air cavity between the top surface of the substrate and said housing cover.

3. A structure according to claim 2, wherein the microstrip substrate is formed of Teflon ™ fiberglass.

4. A structure according to claim 2, wherein said matrix of conducting posts are fixedly attached at one end to said housing cover, said housing cover having a metallized underside coupling with said plurality of conducting posts to form said top ground plane;
    wherein said plurality of conducting posts extend substantially vertically toward the microstrip substrate at their other ends; and
    capacitive air gaps formed between the other ends of the plurality of conducting posts and said microstrip substrate for tuning said plurality of conductive posts.

5. A structure for isolating between spaced apart microwave circuit components and transmission media located on a top surface of a microstrip substrate, comprising
    a housing base supporting the microstrip substrate;
    a housing cover sealed to said housing metal base over the microstrip substrate and forming an air cavity between the top surface of the substrate and said housing cover;
    a plurality of conducting posts forming a periodic array arranged orthogonally to the plane of the microstrip substrate and extending between the microstrip substrate and said housing cover;
    wherein said periodic array of conducting posts are configured as a two-dimensional matrix, said structure further comprising:
    a plurality of holes formed in the microstrip substrate and housing metal base corresponding to said two-dimensional matrix of conducting posts, said plurality of conducting posts being press fit at their one ends into said plurality of holes and extending toward said housing cover at their other ends;
    a conductive layer arranged against the other ends of said conducting posts, and
    a compression layer located against said conductive layer on one side and against said housing cover on its other side for keeping said conductive layer in contact with the other ends of said plurality of conductive posts thereby forming a ground connection at each end of said plurality of conductive posts.

6. A structure according to claim 5, wherein the spaced apart microwave circuit components and transmission media are arranged on the microstrip substrate around said plurality of holes.

7. A structure for isolating between spaced apart microwave circuit components and transmission media located on a top surface of a microstrip substrate, comprising
    a housing base supporting the microstrip substrate;
    a housing cover sealed to said housing metal base over the microstrip substrate and forming an air cavity between the top surface of the substrate and said housing cover;
    a plurality of conducting posts forming a periodic array arranged orthogonally to the plane of the microstrip substrate and extending between the microstrip substrate and said housing cover;
    wherein said periodic array of conducting posts are configured as a two-dimensional matrix, said structure further comprising:
    wherein said housing has a metal underside, the structure further comprising:
    a plurality of cover holes formed in said housing cover corresponding to the two dimensional matrix of conducting posts, said cover holes having metal side walls connected to said metal underside;
    a plurality of base holes formed through the microstrip substrate and housing metal base and aligned substantially vertically with said plurality of cover holes, said plurality of conducting posts being pressed into an interference fit with the side walls of the cover holes and base holes to provide grounding along the conducting posts circumference at both ends.

8. A structure according to claim 7, wherein said plurality of conducting posts are formed of roll posts.

9. A structure according to claim 7, wherein said plurality of cover and base holes are provided with tapered edges near said hole openings for aiding the alignment and insertion of the plurality of conducting posts.

10. A structure for isolating between spaced apart microwave circuit components and transmission media located on a top surface of a microstrip substrate, comprising
 a housing base supporting the microstrip substrate;
 a housing cover sealed to said housing metal base over the microstrip substrate and forming an air cavity between the top surface of the substrate and said housing cover;
 a plurality of conducting posts forming a periodic array arranged orthogonally to the plane of the microstrip substrate and extending between the microstrip substrate and said housing cover;
 wherein said periodic array of conducting posts are configured as a two-dimensional matrix, said structure further comprising:
 said structure further comprising:
 a plurality of base holes formed in the microstrip substrate and housing metal base corresponding to said two-dimensional matrix of conducting posts, said conducting posts being coupled at one end into said base holes and extending toward said housing cover at their other ends;
 a dielectric film arranged against the other ends of said plurality of conducting posts;
 a conductive layer stacked atop of said dielectric film;
 a compression layer arranged between said conductive layer and housing cover for holding the conductive layer and dielectric film against the other ends of said plurality of conducting posts, said conductive layer, dielectric film and conducting posts forming a series coupled inductance and capacitance for series resonance tuning of said conducting posts.

11. A structure according to claim 10, wherein said dielectric film has a predetermined thickness and dielectric constant for accurate tuning of the plurality of conducting posts.

12. A structure according to claim 11, wherein said dielectric film is a dielectric film sheet bonded to said conductive layer.

13. A structure according to claim 11, wherein said dielectric film is deposited onto the other ends of said plurality of conducting posts.

14. A structure according to claim 11, wherein said plurality of conducting posts have a predetermined length and diameter selected for resonance near a desired frequency band for the structure.

15. A structure for isolating between spaced apart microwave circuit components and transmission media located on a top surface of a microstrip substrate, comprising
 a housing base supporting the microstrip substrate;
 a housing cover sealed to said housing metal base over the microstrip substrate and forming an air cavity between the top surface of the substrate and said housing cover;
 a plurality of conducting posts forming a periodic array arranged orthogonally to the plane of the microstrip substrate and extending between the microstrip substrate and said housing cover;
 wherein said periodic array of conducting posts are configured as a two-dimensional matrix, said structure further comprising:
 wherein said housing cover has a metal underside, the structure further comprising:
 a plurality of cover holes formed in said housing cover corresponding to the two dimensional matrix of conducting posts and having cover hole diameters greater than those of said conducting posts, said plurality of cover holes having metallized side walls connected to said metal underside;
 a plurality of base holes formed in the microstrip substrate and housing metal base, said plurality of base holes being vertically aligned with said cover holes, the plurality of conductive posts forming an interference fit at one end with said plurality of base holes; and
 coaxial capacitive air gaps formed between the other ends of said plurality of conductive posts and said cover hole side walls for series tuning portions of the plurality of conductive posts within the air cavity.

16. A structure according to claim 15, wherein a selected number of said plurality of conducting posts are custom tuned via adjustment to the conducting posts length and its associated cover hole diameter.

17. A structure for isolating between spaced apart microwave circuit components and transmission media located on a top surface of a microstrip substrate, comprising
 a housing base supporting the microstrip substrate;
 a housing cover sealed to said housing metal base over the microstrip substrate and forming an air cavity between the top surface of the substrate and said housing cover;
 a plurality of conducting posts forming a periodic array arranged orthogonally to the plane of the microstrip substrate and extending between the microstrip substrate and said housing cover;
 wherein said periodic array of conducting posts are configured as a two-dimensional matrix, said structure further comprising:
 wherein said plurality of conducting posts are fixedly attached at one end to said housing cover, said housing cover having a metallized underside coupling with said plurality of conductive posts to form a top ground connection;
 a plurality of base holes formed in the microstrip substrate and housing metal base corresponding to said two-dimensional matrix configuration of the plurality of conducting posts and having base hole diameters greater than those of said conductive posts; and
 coaxial capacitive air gaps formed between the other ends of said plurality of conducting posts and the base hole side walls for series tuning said plurality of conducting posts.

18. A structure according to claim 17, wherein said plurality of conducting posts are integrally formed with said housing cover via metal fabrication techniques.

19. A structure according to claim 18, wherein said plurality of conducting posts are integrally formed with said housing cover via metal fabrication techniques.

20. A structure according to claim 19, wherein the spaced apart microwave circuit components and transmission media arranged on the microstrip substrate spaced from said plurality of conducting posts.

21. A structure for preventing in-band guided wave propagation, generated from spaced apart microwave circuit components and transmission media, within a dielectric substrate, comprising:
a top surface metallization for the dielectric substrate;
co-planar transmission lines formed on said top surface metallization for coupling the circuit components;
a bottom surface metallization for the dielectric substrate;
a periodic array of metal plated via holes formed in said dielectric substrate for providing top surface to bottom surface conduction paths to prevent in-band guided wave propagation within the dielectric substrate.

22. A structure according to claim 21, wherein said top and bottom metallizations are electroplated chromium/gold compositions.

23. A structure according to claim 21, wherein an annular air gap is fabricated between the top terminations of said periodic array of metal plated via holes and said top surface metallization to series resonance tune the metal plated via holes to provide increased high frequency isolation.

24. A waveguide mode band rejection filter structure for in-substrate and above-substrate isolation of spaced apart microwave circuit components and transmission media, comprising:
a housing base;
a dielectric substrate having top and bottom surface metallization supported on said housing base;
a housing cover, having a metallized underside, sealed to said housing base over the dielectric substrate;
an air cavity formed between the top surface metallization and the metallized underside of said housing cover;
a plurality of conducting posts configured in a two dimensional periodic array, said plurality of conductive posts fixedly attached and electrically coupling at one end to the metallized underside of said housing cover; said plurality of conducting posts further extending substantially vertically toward the dielectric substrate;
capacitive air gaps formed between the other ends of the plurality of conducting posts and the top surface metallization for tuning said plurality of conducting posts to reject above substrate waveguide mode propagation; and
a periodic array of metal plated via holes formed in the dielectric substrate for providing top surface to bottom surface conduction paths to reject in-band guided wave propagation within the dielectric substrate.

25. A filter structure according to claim 24, wherein the plurality of conducting posts and the periodic array of metal plated vias are offset from each other.

26. A method for isolating microwave circuit components and transmission media in a monolithic microwave integrated circuit subsystem assembly, the method comprising the steps of:
fabricating the integrated circuit subsystem on a microstrip substrate in a manner to avoid placement of the circuit components and transmission media in a periodic two dimensional array of locations on the microstrip substrate;
forming a periodic two-dimensional matrix of conducting posts having the same dimensions as the two dimensional array of locations on the microstrip substrate;
electrically coupling the matrix of conducting posts at one end to a top ground plane located above said conducting posts and at the other end to a bottom ground plane supporting the microstrip substrate such that the matrix of conducing posts and the periodic array of locations are in alignment.

27. A method for providing a waveguide mode band rejection filter for an air cavity formed in a microcircuit assembly between a metal housing cover and a housing metal base, the method comprising the steps of:
supporting a microstrip substrate with the housing metal base;
arranging a two-dimensional periodic array of conducting posts substantially vertical to said microstrip substrate and extending between said microstrip substrate and the housing cover;
designing a microwave circuit layout around said conducting posts; and
providing capacitances at one end of said periodic array of conducting posts to series tune said conducting posts through the electrical connection formed from the metal housing cover through the capacitance and conductive posts to the housing metal base.

* * * * *